US012641841B2

(12) United States Patent
Berthelon et al.

(10) Patent No.: US 12,641,841 B2
(45) Date of Patent: May 26, 2026

(54) ELECTRONIC DEVICE MANUFACTURING METHOD

(71) Applicant: STMicroelectronics (Crolles 2) SAS, Crolles (FR)

(72) Inventors: Remy Berthelon, Crolles (FR); Olivier Weber, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 278 days.

(21) Appl. No.: 18/330,287

(22) Filed: Jun. 6, 2023

(65) Prior Publication Data

US 2023/0411450 A1 Dec. 21, 2023

(30) Foreign Application Priority Data

Jun. 16, 2022 (FR) ...................................... 2205853

(51) Int. Cl.
| | |
|---|---|
| *H01L 29/26* | (2006.01) |
| *H01L 21/321* | (2006.01) |
| *H01L 21/762* | (2006.01) |
| *H10D 62/10* | (2025.01) |
| *H10B 63/10* | (2023.01) |

(52) U.S. Cl.
CPC ....... *H10D 62/115* (2025.01); *H01L 21/3212* (2013.01); *H01L 21/76229* (2013.01); *H10B 63/10* (2023.02)

(58) Field of Classification Search
CPC .............. H10D 62/115; H01L 21/3212; H01L 21/76229; H10B 63/10
See application file for complete search history.

(56) References Cited

U.S. PATENT DOCUMENTS

| | | | |
|---|---|---|---|
| 5,646,888 A | 7/1997 | Mori | |
| 10,381,344 B2 | 8/2019 | Weber et al. | |
| 2007/0059876 A1 | 3/2007 | Chi et al. | |
| 2009/0121271 A1* | 5/2009 | Son ........................ | H10B 43/27 |
| | | | 257/315 |
| 2009/0206443 A1 | 8/2009 | Juengling | |
| 2012/0099363 A1 | 4/2012 | Inaba | |

(Continued)

FOREIGN PATENT DOCUMENTS

| | | |
|---|---|---|
| EP | 0547711 A2 | 6/1993 |
| FR | 3003690 A1 | 9/2014 |
| FR | 3049111 A1 | 9/2017 |

*Primary Examiner* — Tracie Y Green

(74) *Attorney, Agent, or Firm* — Seed Intellectual Property Law Group LLP

(57) ABSTRACT

The present description concerns a method of manufacturing a device comprising a first portion having an array of memory cells formed therein and a second portion having transistors formed therein, the method comprising: a. the forming of first insulating trenches separating from one another the substrate regions of a same cell row, and b. the forming of second trenches separating from one another the regions of a same cell column, the second trenches having a height greater than the height of the first trenches, step a. comprising the independent forming of a lower portion and of an upper portion of each first trench, the forming of the upper portions comprising the deposition of a first insulating layer, the etching of the portions of the first insulating layer which are not located on the upper portions.

20 Claims, 5 Drawing Sheets

(56) References Cited

U.S. PATENT DOCUMENTS

| | | | |
|---|---|---|---|
| 2013/0161730 A1* | 6/2013 | Pan | H10B 12/053 |
| | | | 257/E27.06 |
| 2015/0048475 A1* | 2/2015 | Tsai | H01L 21/76224 |
| | | | 257/506 |
| 2016/0071758 A1* | 3/2016 | See | H01L 21/3083 |
| | | | 438/151 |
| 2018/0159023 A1* | 6/2018 | Suh | H10N 50/80 |
| 2023/0063917 A1* | 3/2023 | Hou | H01L 21/30604 |

* cited by examiner

Fig. 1
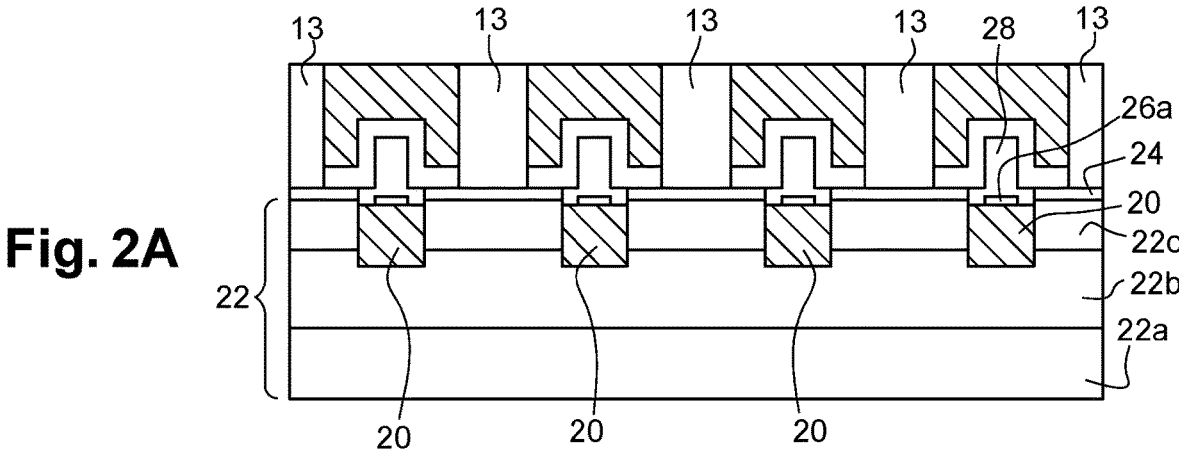
Fig. 2A
Fig. 2B
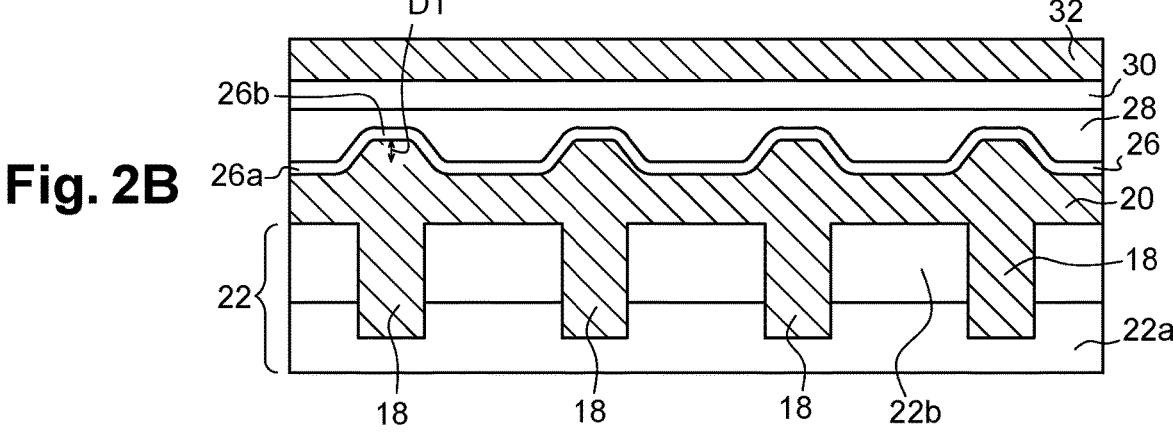

ELECTRONIC DEVICE MANUFACTURING METHOD

CROSS-REFERENCE TO RELATED APPLICATION(S)

This application claims the priority benefit of French patent application number FR2205853, filed on Jun. 6, 2022, entitled "Procédé de fabrication de dispositifs électroniques," which is hereby incorporated by reference to the maximum extent allowable by law.

BACKGROUND

Technical Field

The present disclosure generally concerns methods of manufacturing electronic devices, and more particularly devices comprising memory cells.

Description of the Related Art

Electronic devices comprising memories for example comprise arrays of memory cells. Memory cell arrays comprise rows and columns of memory cells, the cells of a same row being coupled by a bit line and the cells of a same column being coupled by a word line.

BRIEF SUMMARY

An embodiment overcomes all or part of the disadvantages of known electronic device manufacturing methods.

An embodiment provides a method of manufacturing a device comprising a first portion having an array of memory cells formed therein and a second portion having transistors formed therein, each memory cell being located on a region of a substrate, the method comprising the following steps:

the forming of first insulating trenches separating from one another the substrate regions of a same cell row, and the forming of second trenches separating from one another the substrate regions of a same cell column, the second trenches having a height greater than the height of the first trenches, step a. comprising the following steps:

a1. the forming of a lower portion of each first trench, and a2. the forming of an upper portion of each first trench, the forming of the upper portions comprising the deposition of a first insulating layer and the etching of the portions of the first insulating layer which are not located on the upper portions.

According to an embodiment, the substrate is of substrate-on-insulator type in the second portion of the device.

According to an embodiment, the method comprises, before steps a. and b., a step c. of removal, in the first portion, of the upper semiconductor layer of a substrate of substrate-on-semiconductor type and the growth of the insulating material of the intermediate insulating layer of the substrate of substrate-on-semiconductor type along a height at least equal to the height of the upper semiconductor layer of the substrate, the intermediate layer being made of a first insulating material.

According to an embodiment, the method comprises, before steps a. and b. and after step c., step d. of forming of the first layer on the first and second portions.

According to an embodiment, step a2. comprises the forming of first openings in the first layer in front of the locations of the regions, and step a1. comprises the etching of the intermediate layer through the first openings, step a2. comprising, after step a1., the removal of the portions of the first layer located in the second portion, the first layer being made of a second insulating material.

According to an embodiment, step a2. comprises the removal of the portions of the first layer located outside of the first portion and the removal of the portions of the intermediate layer and of the first layer located at the locations of the first trenches, the first layer being made of the first insulating material.

According to an embodiment, the method comprises, after step a. and before step b., a step e. of growth of the lower layer of the substrate of semiconductor-on-insulator type at the locations of the regions.

According to an embodiment, the method comprises, after step e., a step f. of forming of a stack comprising a second layer made of the first material and a third layer made of the second material on the first and second portions.

According to an embodiment, the first and second materials are selectively etchable with respect to each other.

According to an embodiment, the first material is silicon oxide and the second is silicon nitride.

According to an embodiment, step b. comprises, after step f., the forming of second openings in the third layer of the stack in front of the locations of the second trenches, the forming of cavities through the second openings, and the forming, on the first and second portions, of a fourth layer made of the first material sufficiently thick to fill the cavities.

According to an embodiment, the method comprises, after step b., a step g. of removal by chemical mechanical polishing of the portions of the fourth layer located above the third layer of the stack and a step h. of removal of the third layer.

According to an embodiment, the method comprises, after step h., steps of doping of the substrate.

According to an embodiment, the method comprises the deposition of silicon strips on the upper portions of the first trenches.

Another embodiment provides a device comprising a first portion having an array of memory cells arranged therein and a second portion having transistors arranged therein, each memory cell being located on a region of a substrate, the device comprising first insulating trenches separating from one another the substrate regions of a same cell row, and second trenches separating from one another the substrate regions of a same cell column, the second trenches having a height greater than the height of the first trenches, wherein the upper surfaces of the first and second trenches are separated by a distance shorter than 10 nm.

Another embodiment provides a device comprising a first portion having an array of memory cells arranged therein and a second portion having transistors arranged therein, each memory cell being located on a region of a substrate, the device comprising first insulating trenches separating from one another the substrate regions of a same cell row, and second trenches separating from one another the substrate regions of a same cell column, the second trenches having a height greater than the height of the first trenches, wherein each first trench comprises a lower portion made of a first material and a lower portion made of a second material different from the first material, where the second trenches do not comprise the second material.

BRIEF DESCRIPTION OF THE SEVERAL VIEWS OF THE DRAWINGS

The foregoing features and advantages, as well as others, will be described in detail in the rest of the disclosure of specific embodiments given by way of illustration and not limitation with reference to the accompanying drawings, in which:

FIG. 1 schematically shows a top view of an array of memory cells;

FIG. 2A shows a cross-section view of the device of FIG. 1 in the direction of a word line;

FIG. 2B shows a cross-section view of the device of FIG. 1 in the direction of a bit line;

DETAILED DESCRIPTION

Figures 3A, 3B, 3C, 3D:
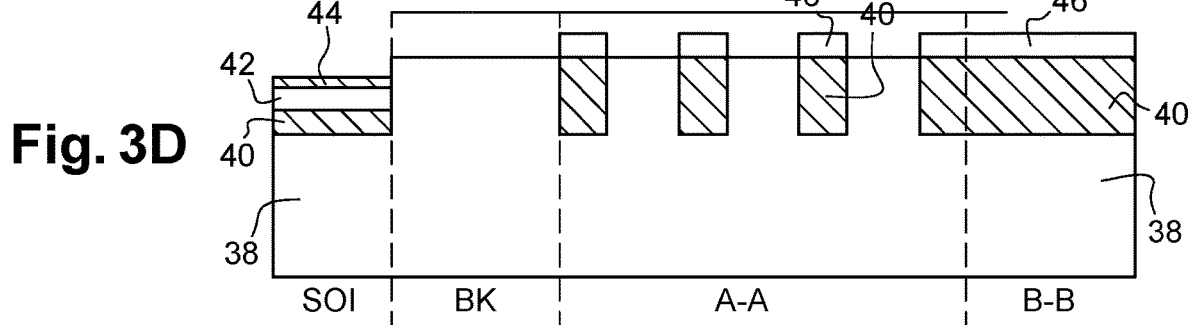
FIG. 3A, FIG. 3B, FIG. 3C, FIG. 3D, FIG. 3E, FIG. 3F, FIG. 3G, FIG. 3H show steps, preferably successive, of an electronic device manufacturing method.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made, unless specified otherwise, to the orientation of the figures.

Unless specified otherwise, the expressions "around," "approximately," "substantially" and "in the order of" signify within 10%, and preferably within 5%.

FIG. 1 schematically shows a top view of an electronic device comprising an array 10 of memory cells 12.

Cells 12 are formed on a same substrate, not shown in FIG. 1. Each memory cell for example comprises a via 13 resting on the substrate and having the rest of the cell resting thereon. The memory cells are for example phase-change memory cells. Thus, each cell comprises a layer, not shown, of phase-change material. Said layer is for example located between two metal layers, not shown, the lower layer for example resting on the via 13 of the cell.

Array 10 comprises a plurality of columns 14 of memory cells 12 and a plurality of rows 16 of memory cells 12. Only three rows and three columns are shown in FIG. 1.

The different rows 16 of memory cells are separated from one another by shallow insulating trenches (Shallow Trench Insulation—STI) 18. Each row 16 of memory cells is thus separated from each neighboring row 16 by a trench 18.

The different columns 14 of memory cells are separated from one another by super shallow insulating trenches (Super Shallow Trench Insulation—SSTI) 20. Each column 14 of memory cells is thus separated from each neighboring column 14 by a trench 20.

In other words, rows 16 and trenches 18 extend in a same direction, for example, the direction of the bit line, and are thus substantially parallel to one another. Similarly, columns 14 and trenches 20 extend in a same direction, for example, the direction of the word line, and are thus substantially parallel to one another. The direction in which trenches 18 extend and the direction in which trenches 20 extend are substantially orthogonal. In top view, that is, in the plane of FIG. 1, the direction in which trenches 18 extend and the direction in which trenches 20 extend are substantially perpendicular.

The device for example comprises a chip comprising various electronic components. Memory array 10 is for example located on the chip. For example, the chip having array 10 arranged thereon comprises the substrate, the array located on a region of the substrate, and components, for example, logic components, located in another region of the substrate. The components comprise, for example, as a majority, transistors. The transistors, and possibly other components located around the array, comprise polysilicon, for example, in the gate of the transistors. During the manufacturing of a chip, it is useful to ensure that the density of polysilicon is not too uneven. For this purpose, polysilicon lines, not shown in FIG. 1, are for example placed in the memory arrays. For example, a polysilicon line is for example located on each trench 20. Preferably, the polysilicon lines are not used in the device for other functions than the homogenizing of the polysilicon density. Preferably, the polysilicon lines are not electrically coupled to electronic components other than themselves.

FIG. 2A shows a cross-section view of the device of FIG. 1 in the direction of a word line. FIG. 2B shows a cross-section view of the device of FIG. 1 in the direction of a bit line. More precisely, FIG. 2A shows a cross-section view of the device of FIG. 1 in plane A-A of FIG. 1 and FIG. 2B shows a cross-section view of the device of FIG. 1 in plane B-B of FIG. 1.

The device comprises a substrate 22. Substrate 22 is a semiconductor substrate, for example, made of silicon. Substrate 22 for example comprises a lower doped region 22a of a first conductivity type, for example, P-type doped. Substrate 22 for example comprises an intermediate doped region 22b, of a second conductivity type, for example, P-type doped. Region 22b covers, preferably entirely, region 22a.

Substrate 22 comprises upper regions 22c. Each memory cell is located on a, preferably a single, region 22c. Regions 22c thus form an array corresponding to the array of memory cells. The array of regions 22c thus comprises rows extending in the same direction as the rows of the array of memory cells and columns extending in the same direction as the columns of the array of memory cells. The array of regions 22c thus comprises rows extending in front of the rows of the array of memory cells and columns extending in front of the columns of the array of memory cells. The regions 22c of the array having regions 22c located thereon are for example doped with the first conductivity type. For example, certain regions 22c, for example regions having no memory cell located thereon, are doped with the second conductivity type and are in contact with a via, to deliver a voltage to region 22b.

The regions 22c of a same row of the array of regions 22c are separated from one another by trenches 20. Trenches 20 extend from the upper surface of regions 22c, in particular from the upper surface of the neighboring regions 22c, to region 22b. Trenches 20 extend at least along the entire height of regions 22c. Trenches 20 extend for example along part of the height of region 22b.

The regions 22c of a same column of the array of regions 22c are separated from one another by trenches 18. Trenches 18 extend from the upper surface of regions 22c, in particular from the upper surface of the neighboring regions 22c, to region 22a. Trenches 18 extend at least along the entire height of regions 22b and 22c. Trenches 18 for example extend along part of the height of region 22a.

Regions 22c are preferably each covered with a metal layer 24. Layers 24 preferably only cover the upper surface of regions 22c. Vias 13 each rest on a layer 24. Thus, vias 13 are electrically coupled to regions 22c by layers 24. Thus, a current may be delivered to each memory cell, in particular to the via 13 of each cell, via the region 22c and the layer 24 corresponding to this cell.

The device further comprises metal strips 26. Strips 26 are for example made of titanium nitride. A strip 26 is located on each trench 20. Strips 26 preferably extend along the entire length of the array, in the direction of trenches 20. Thus, strips 26 for example extend along the entire length of trenches 20.

The width of strips 26 is smaller than the width of trenches 20. By width of strips 26, there is meant the dimension of strips 26 in the direction from a lateral wall of a trench 20 to the other lateral walls, that is, in the direction of a word line.

Each strip 26 is covered with a polysilicon layer 28. Each strip 26 is preferably entirely covered with layer 28. Thus, strip 26 is entirely buried between trench 20 and layer 28. Layers 28 enable to homogenize the polysilicon density in the device. In other words, layers 28 enable to ensure that the polysilicon density difference between the memory array and the areas comprising the transistors is not too high to allow the manufacturing of the device.

Each layer 28 is covered with an electrically-insulating layer 30, for example made of silicon nitride. Layer 30 is for example covered with an electrically-insulating layer 32, for example, made of silicon oxide. Vias 13 are for example entirely laterally surrounded with insulating layers 30 and 32.

In known manufacturing methods, the steps of manufacturing of trenches 18 and 20 cause the forming of trenches 18 and 20 having non-coplanar upper surfaces. Thus, the strips 26 deposited on trenches 20 are not planar. Each strip 26 for example comprises portions 26a being located in a lower plane and portions 26b located in an upper plane. The distance D1 between the lower and upper planes is for example in the range from 10 nm to 30 nm. Portions 26a are for example adjacent to regions 22c and portions 26b are for example adjacent to trenches 18. Thus, regions 22c are separated from one another by trench portions 20 having portions 26a resting thereon.

As shown in FIG. 2A, portions 26a are close to regions 22c and layers 24. For example, the lower plane having portions 26a located therein is for example in the plane of layers 24 or in a lower plane, that is, in a plane comprising regions 22c. The risk of interference between strips 26 and regions 22c and layers 24 is thus significant. Indeed, the distance between each portion of insulating material located between a strip 26 and the neighboring regions 22c, or the neighboring layers 24, risks being sufficiently low to allow the forming of a current between neighboring regions 22c, or the neighboring regions 24, via strip 26. The reading and the programming of the memory cells would then be disturbed.

FIG. 3A, FIG. 3B, FIG. 3C, FIG. 3D, FIG. 3E, FIG. 3F, FIG. 3G, FIG. 3H show steps, preferably successive, of a method of manufacturing an electronic device comprising memory cells. FIGS. 3A to 3H comprise:

a first portion showing the steps in a portion SOI of the device comprising components, for example, logic components, formed on a portion of semiconductor-on-insulator (SOI) type of a substrate;

a second portion showing the steps in a solid portion (bulk) BK of the device comprising components, for example, logic components, formed on a solid substrate portion of the substrate;

a third portion A-A showing a portion A-A of the device comprising a memory array in cross-section plane A-A, that is, the plane of FIG. 2A; and a fourth portion B-B showing the portion B-B of the device comprising a memory array in cross-section plane B-B, that is, the plane of FIG. 2B. The first, second, and third portions are located on a same substrate.

During the step resulting in the structure of FIG. 3A, an etch mask 34 is formed on a substrate 36 of semiconductor-on-insulator (SOI) type in portion SOI of the substrate. Substrate 36 comprises a lower semiconductor layer 38, for example, made of silicon, an insulating layer 40, for example, made of silicon oxide, covering layer 38, and an upper semiconductor layer 42, for example, made of silicon. Mask 34 is for example made of silicon nitride. A silicon oxide layer 44 is for example formed on layer 42 before the forming of mask 34. Mask 34 is for example thus separated from layer 42 by layer 44.

Mask 34 is formed to have openings at the level of the portions of the substrate corresponding to portions BK and A-A, B-B of FIG. 3A.

Layers 42 and 44 are then etched through the openings in mask 34. Thus, layers 42 and 44 are removed from the portions of the substrate corresponding to the portions BK and A-A, B-B of FIG. 3A.

Layer 40 then undergoes a growth step. During this step, layer 40 in the portions of the substrate corresponding to the portions BK, A-A, B-B of FIG. 3A grows to reach an upper level at the upper surface level of layer 44 of portion SOI, for example to reach the level of the upper surface of layer 34. In the example of FIG. 3A, the upper surface of layer 34 in portion SOI and the upper surface of layer 40 in portions BK, A-A, B-B are coplanar.

During the step resulting in the structure of FIG. 3B, mask 34 is removed. A layer 46 of a material capable of being selectively etched over the material of layer 40 is formed on the structure, that is, on layer 40, in portions BK, A-A, B-B, and on layer 44 in portion SOT. By selectively etchable, there is meant that there exists an etch method with which the material of layer 46 is etched at least twice faster than the material of layer 40. Layer 46 is for example made of silicon nitride. Preferably, the materials of layers 40 and 46 are selectively etchable with respect to each other.

During the step resulting from the structure of FIG. 3C, openings are formed in layer 46 so that layer 46 forms an etch mask.

In particular, an opening is formed in front of portion BK, that is, the portion of the substrate forming a solid substrate, and in front of the regions 22c of portion A-A, B-B.

Layer 40 is then etched through the openings. Thus, layer 40 is removed from portions BK and from the locations of regions 22c.

During the step resulting in the structure of FIG. 3D, layer 38 undergoes a growth step. More precisely, the portions of layer 38 exposed during the step of FIG. 3C undergo a growth step. Thus, layer 38 extends, in portion BK and at the locations of regions 22c, in the openings formed during the step of FIG. 3C. Preferably, layer 38 extends, in portion BK and at the locations of regions 22c, to an upper level at the level of the upper surface of layer 42. For example, layer 38 extends, in portion BK and at the locations of regions 22c, to the level of the upper surface of layer 40 in portion A-A, B-B. The upper surface of layer 38 in portion BK and at the locations of regions 22c is for example coplanar with the upper surface of layer 40 in portion A-A, B-B.

The portion of layer 46 located in portion SOI is then removed. Thus, at the end of the steps of FIGS. 3C and 3D, layer 46 is then entirely removed, except for the portions located on the portions of the layer 40 of portion A-A, B-B, which correspond to the trenches 20 located in the memory array. This thus corresponds to a step of raising of the portions of the layer 40 of portion A-A, B-B which correspond to the trenches 20 located in the memory array. Thus, each trench 20 comprises a lower portion, formed by a portion of layer 40, and an upper portion, formed by a portion of layer 46.

Figures 3E, 3F, 3G, 3H:
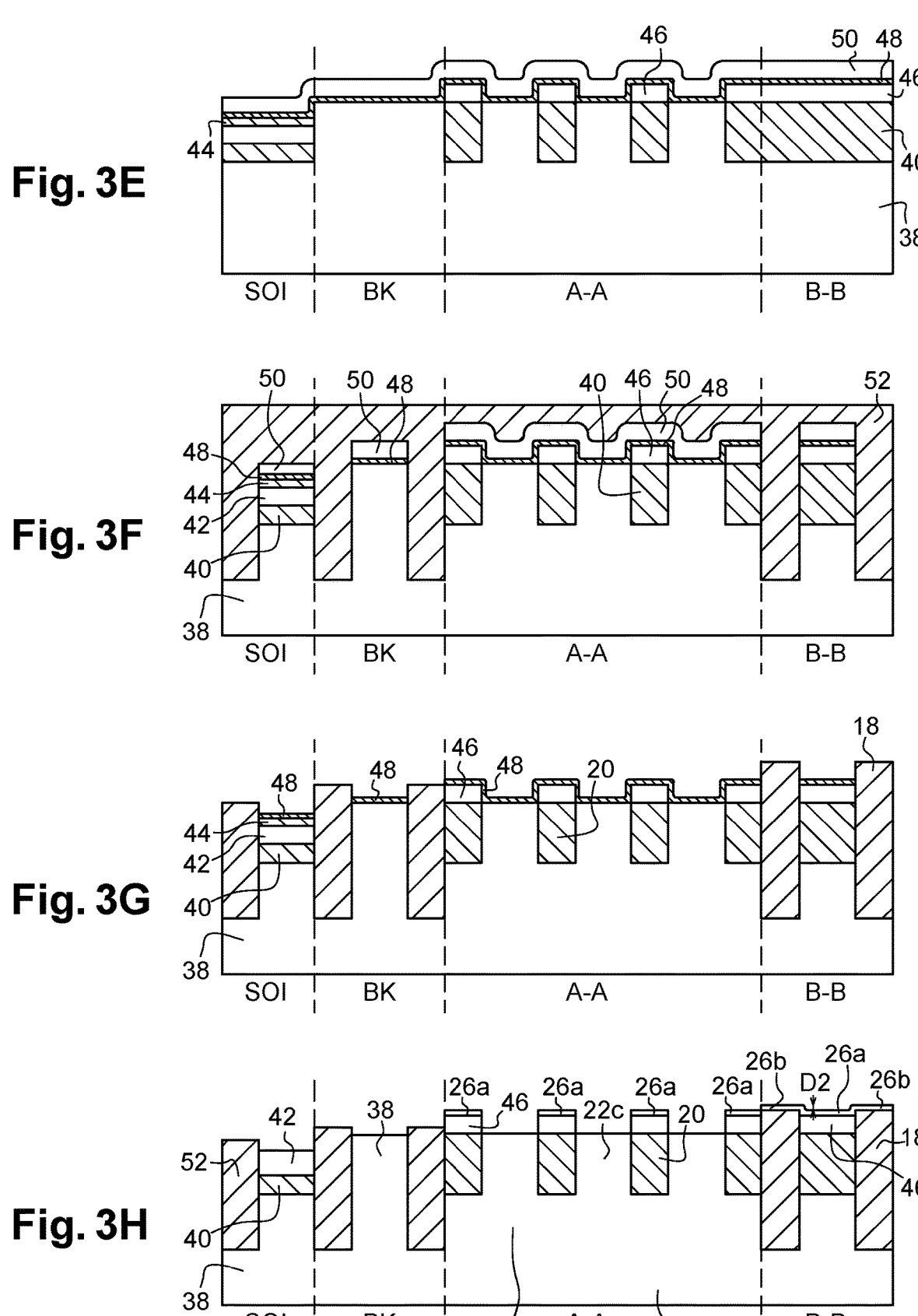

During the step resulting in the structure of FIG. 3E, a stack of an insulating layer 48 and of an insulating layer 50 is formed on the structure resulting from the step of FIG. 3D.

Layer 48 is conformally formed on the structure. Layer 48 thus covers, preferably entirely, the layer 44 of portion SOI. More precisely, layer 48 thus covers, preferably entirely, the upper surface of layer 44 of portion SOI. Layer 48 covers, preferably entirely, the layer 38 of portion BK. More precisely, layer 48 covers, preferably entirely, the upper surface of the layer 38 of portion BK. Layer 48 covers, preferably entirely, the portions of layer 46 and layer 38 of portion A-A, B-B. More precisely, layer 48 covers, preferably entirely, the upper surface of the layer 38 of portion A-A, B-B, the upper surface of the layer 38 of portion A-A, B-B, and the upper and lateral surfaces of the portions of layer 46 of portion A-A, B-B.

Layer 50 covers, preferably entirely, layer 48. The portions of layer 46 which have not been removed by the etching of the step of FIG. 3D, that is, the portions of layer 46 located on the portions of layer 40 forming trenches 20, are separated from layer 50 by layer 48.

Preferably, layer 48 is made of the same material as layer 40. Layer 48 is for example made of silicon oxide.

Layer 50 is for example made of the same material as layer 46. Layer 50 is for example made of silicon nitride. Layer 50 is made of a material selectively etchable over the material of layer 48.

The thickness of layer 50 is such that the level, or plane, of the portion of the upper surface of layer 50 closest to layer 38 is separated from layer 38 by the level of the portion of the upper surface of layer 48 most distant from layer 38. In other words, the level of the portion of the upper surface of layer 50 closest to layer 38 is only covered with portions of layer 50.

During the step resulting in the structure of FIG. 3F, openings are formed in layer 50, forming an etch mask, in front of the locations of the shallow trenches (STI). Shallow trenches may be formed in portions SOI, BK, and A-A, B-B. In particular, in portion A-A, B-B, that is, in the portion of the chip having the memory array formed therein, the shallow trenches comprise the trenches 18 of FIGS. 2A and 2B. Shallow trenches for example all have substantially the same depth. An etch step is then performed through said openings in layer 50 to form cavities at the locations of trenches 18.

In portion SOI, the portions of layers 38, 40, 42, 44, and 48 located at the locations of the shallow trenches are etched through the openings in layer 50. Thus, layers 40, 42, 44, and 48 are preferably entirely crossed by the cavities formed by the etching. Layer 38 is preferably partially crossed by the cavities formed by the etching.

In portion BK, the portions of layers 38 and 48 located at the locations of the shallow trenches are etched through the openings in layer 50. Thus, layer 48 is preferably entirely crossed by the cavities formed by the etching. Layer 38 is preferably partially crossed by the cavities formed by the etching.

In portion A-A, B-B, that is, in the portion having the memory array formed therein, the portions of layers 38, 40, 46, and 48 located at the locations of shallow trenches 18 are etched through the openings in layer 50. Thus, layers 40, 46, and 48 are preferably entirely crossed by the cavities formed by the etching. Layer 38 is preferably partially crossed by the cavities formed by the etching.

A layer 52 is formed on the structure. The thickness of layer 52 is such that layer 52 fills the cavities formed at the locations of the shallow trenches and covers, preferably entirely, layer 50.

Layer 52 is made of an electrically-insulating material, for example, of silicon oxide. Preferably, layer 52 is made of the same material as layer 48. Preferably, layer 52 is made of the same material as layer 40.

During the step resulting in the structure of FIG. 3G, the structure undergoes a polishing step, for example, by a chemical mechanical polishing step. The polishing method is carried out to expose, preferably, entirely, layer 50.

In portion SOT, the portion of layer 52 located above the level of the upper surface of layer 50 is for example removed. The upper surface of the device in portion SOI is thus planar and comprises the upper surface of layer 50 laterally surrounded with the upper surface of layer 52.

In portion BK, the portion of layer 52 located above the level of the upper surface of layer 50 is for example removed. The upper surface of the device in portion BK is thus planar and comprises the upper surface of layer 50 laterally surrounded with the upper surface of layer 52.

In portion A-A, B-B, layers 50 and 52 are polished to remove all the material of layer 52 located above layer 50. Thus, layers 50 and 52 are removed all the way to the level of the portion of layer 50 closest to layer 38.

The portions of layer 50 are then removed by a method of etching of the material of layer 50 selective over the material of layer 48 and the material of layer 52. Thus, the plane of the upper surface of the shallow trenches is separated from the plane of the upper surface of layer 48 by a height substantially corresponding to the thickness of layer 50.

During the step resulting in the structure of FIG. 3H, various electronic component manufacturing steps may be carried out. In particular, semiconductor material doping steps are carried out. The layer 42 of portion SOI and the layer 38 of portion BK are for example doped to form electronic components, in particular transistors. Similarly, the layer 38 of portion A-A, B-B is doped to form regions 22a, 22b, and 22c.

The doping steps for example comprise the forming and the removal of masks, for example, lithophotography masks. These steps cause the partial removal of the material of layer 48 and of the shallow trenches. Thus, layer 48 is removed during these steps. Preferably, the thickness of layer 48 is such that layer 48 is fully removed. The portions of layer 46 located on trenches 20 are not removed. Further, the height of the shallow trenches, in particular the trenches 18 of the memory array, is decreased by the steps of forming and of removal of the masks.

Strips 26 are then formed on the portions of layer 46 located on portions of layer 40. Layer 28, not shown in FIG. 3H, made of polysilicon is then formed on the structure.

The presence and the holding of the portions of layer 46 enable to decrease the distance between portions 26a and 26b. Thus, the lower and upper planes, that is, portions 26a and 26b, are separated by a distance D2, shorter than distance D1. In other words, the upper surfaces of trenches 18 and 20 are separated by distance D2. Distance D2 is for example shorter than 10 nm. Further, portions 26a are more strongly separated from regions 22c, which enables to avoid current leakages.

The memory cells are then formed on regions 22c. In particular, vias 13 are then formed on regions 22c.

FIG. 4A, FIG. 4B, FIG. 4C, FIG. 4D, FIG. 4E, FIG. 4F, FIG. 4G, FIG. 4H show steps, preferably successive, of another electronic device manufacturing method.

Figure 4A:
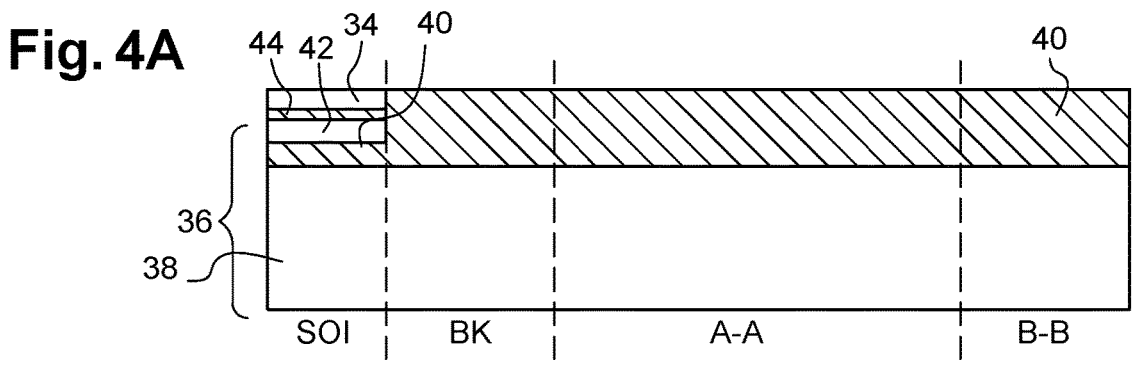
FIG. 4A, FIG. 4B, FIG. 4C, FIG. 4D, FIG. 4E, FIG. 4F, FIG. 4G, FIG. 4H show steps, preferably successive, of another electronic device manufacturing method.

During the step resulting in the structure of FIG. 4A, as during the step resulting in the structure of FIG. 3A, an etch mask 34 is formed on a substrate 36 of semiconductor-on-insulator (SOI) type. Substrate 36 comprises a lower semiconductor layer 38, for example, made of silicon, an insulating layer 40, for example, made of silicon oxide, covering layer 38, and an upper semiconductor layer 42, for example, made of silicon. Mask 34 is for example made of silicon nitride. A silicon oxide layer 44 is for example formed on layer 42 before the forming of mask 34. Mask 34 is thus for example separated from layer 42 by layer 44.

Mask 34 is formed to have openings at the level of the substrate portions corresponding to portions BK, A-A, B-B of FIG. 3A.

Layers 42 and 44 are then etched through the openings in mask 34. Thus, layers 42 and 44 are removed from the portions of the substrate corresponding to the portions BK, A-A, B-B of FIG. 3A.

Layer 40 then undergoes a growth step. During this step, layer 40 in the substrate portions corresponding to the portions BK, A-A, B-B of FIG. 3A grows to reach an upper level at the level of the upper surface of layer 44 of portion SOI, for example to reach the level of the upper surface of layer 34. In the example of FIG. 3A, the upper surface of layer 34 in portion SOI and the upper surface of layer 40 in portions BK, A-A, and B-B are coplanar.

Figure 4B:
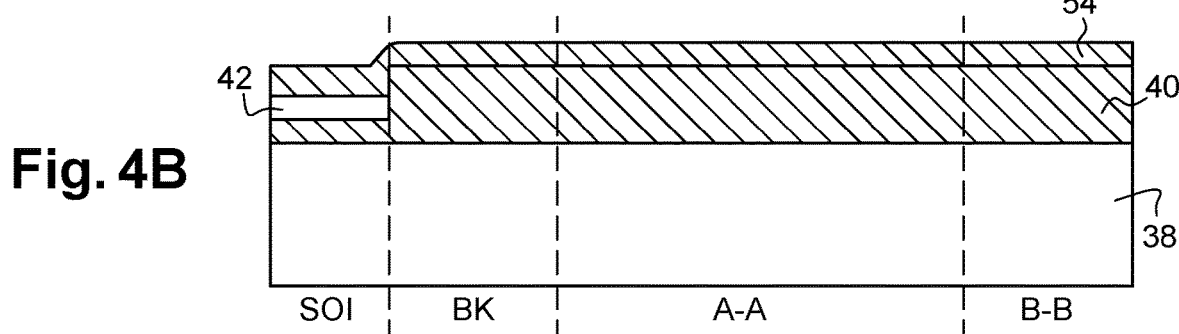

During the step resulting in the structure of FIG. 4B, mask 34 and layer 44 are removed. A layer 54 is formed on the structure, that is, on layer 40, in portions BK, A-A, B-B, and on layer 44 in portion SOI. Layer 54 is preferably made of the same material as layer 40. Layer 54 is for example made of silicon oxide.

Figure 4C:
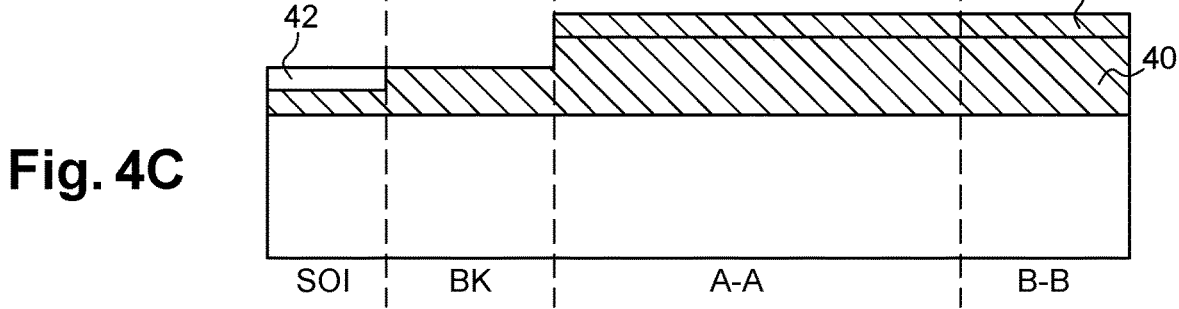

During the step resulting in the structure of FIG. 4C, the portions of layer 40 and 54 located, in portions SOI and BK, under the plane of the upper surface of layer 42 are removed. Layers 40 and 54 are not etched in portion A-A, B-B, that is, the portion corresponding to the memory array.

This thus corresponds to a step of raising of the portions of the layer 40 of portion A-A, B-B which correspond to the trenches 20 located in the memory array.

Figure 4D:
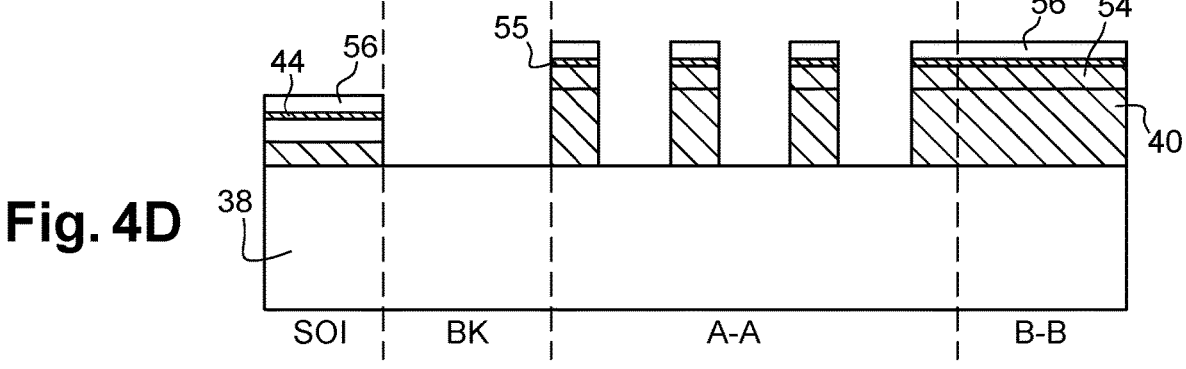

During the step resulting in the structure of FIG. 4D, a layer 55 is formed on the structure. Layer 55 is made of an insulating material, preferably of the same material as layer 40, for example, of silicon oxide. Layer 55 covers layer 42 in portion SOI, layer 38 in portion BK, and layer 54 in portion A-A, B-B.

Layer 55 is covered, preferably entirely, with a layer 56 of a material that can be selectively etched over the material of layers 40 and 54. Layer 46 is for example made of silicon nitride.

Openings are formed in layer 56 so that layer 56 forms an etch mask. In particular, an opening is formed in front of portion BK, that is, the portion of the substrate forming a solid substrate, and in front of the regions 22c of portion A-A, B-B.

The layers located between layer 56 and layer 38, that is, the substrate, are then etched through the openings. Thus, layer 40 is removed from portion BK. Further, the portions of layers 40, 54, and 55 located in front of the openings, that is, at the locations of regions 22c, are etched.

Figure 4E:
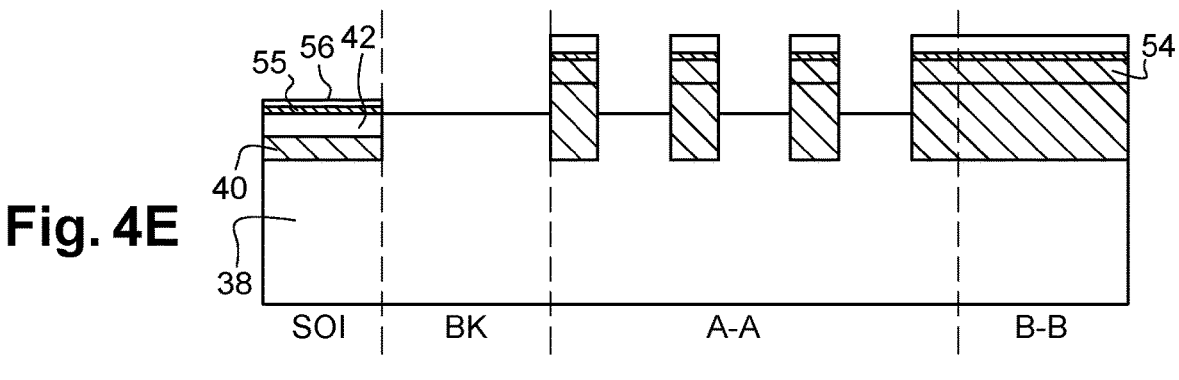

During the step resulting in the structure of FIG. 4E, layer 38 undergoes a growth step. More precisely, the portions of layer 38 exposed during the step of FIG. 4D undergo a growth step. Thus, layer 38 extends, in portion BK and at the locations of regions 22c, in the openings formed during the step of FIG. 4D. Preferably, layer 38 extends, in portion BK and at the locations of regions 22c, all the way to the level of the upper surface of layer 42 in portion SOI. The upper surface of layer 38 in portion BK and at the locations of regions 22c is for example coplanar with the upper surface of layer 42 in portion SOI.

Figure 4F:
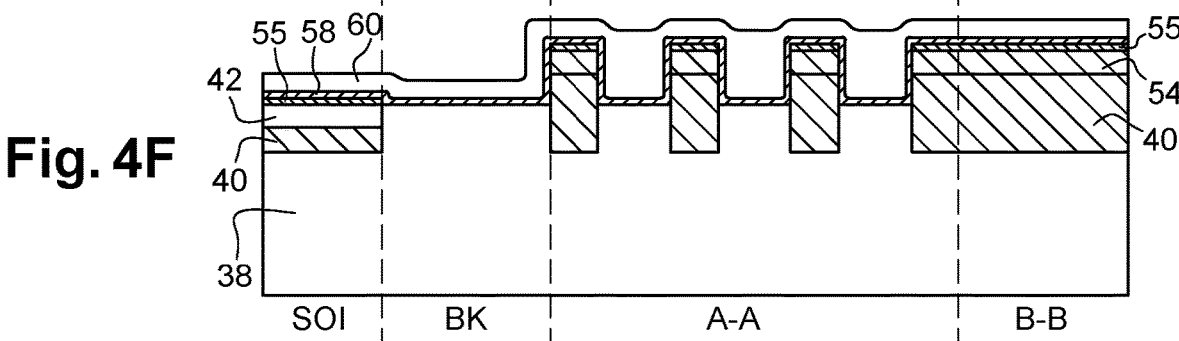

During the step resulting in the structure of FIG. 4F, the portion of layer 56 located in portion SOI is then removed. Thus, after the steps of FIGS. 4E and 4F, layer 56 as been totally removed, except for the portions located on the portions of layer 40 of portion A-A, B-B, which correspond to the trenches 20 located in the memory array.

Further, a layer 58 is formed on the structure. Layer 58 is made of an insulating material, preferably of the same material as layer 40, for example, of silicon oxide. Layer 58 covers layer 55 in portion SOI, layer 35 in portion BK, and layer 55 in portion A-A, B-B.

Layer 58 is covered, preferably entirely, with a layer 60 of a material that can be selectively etched over the material of layers 40 and 58. Layer 60 is for example made of silicon nitride.

The thickness of layer 60 is such that the level, or plane, of the portion of the upper surface of layer 60 closest to layer 38 is separated from layer 38 by the level of the portion of the upper surface of the layer 58 most distant from layer 38. In other words, the level of the portion of the upper surface of layer 60 closest to layer 38 is only covered with portions of layer 60.

Figure 4G:
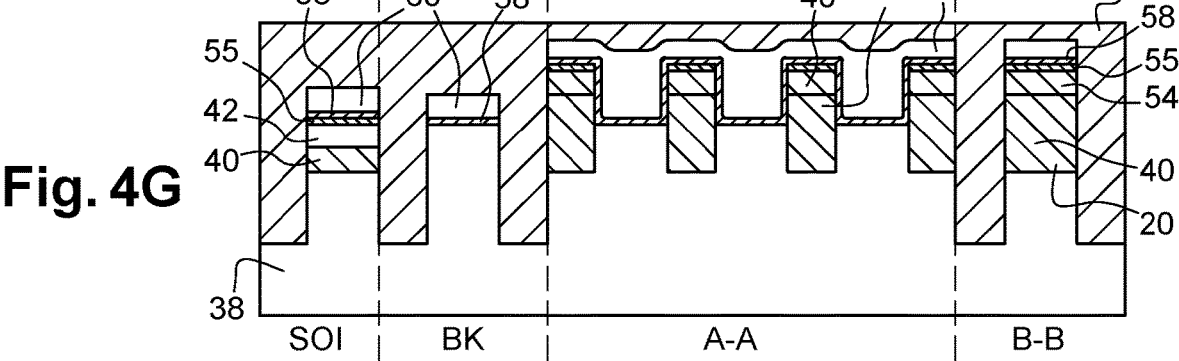

During the step resulting in the structure of FIG. 4G, openings are formed in layer 60, forming an etch mask, in front of the locations of the shallow trenches (STI). Shallow trenches may be formed in portions SOI, BK, and A-A, B-B. In particular, in portion A-A, B-B, that is, in the portion of the chip having the memory array formed therein, the shallow trenches comprise the trenches 18 of FIGS. 2A and 2B. The shallow trenches for example all have substantially the same depth. An etch step is then carried out through said openings in layer 60 to form cavities at the locations of trenches 18.

In portion SOI, the portions of layers 38, 40, 42, 55, and 58 located at the locations of the shallow trenches are etched through the openings in layer 60. Thus, layers 40, 42, 55, and 58 are preferably entirely crossed by the cavities formed by the etching. Layer 38 is preferably partially crossed by the cavities formed by the etching.

In portion BK, the portions of layers 38 and 58 located at the locations of the shallow trenches are etched through the openings in layer 60. Thus, layer 58 is preferably entirely crossed by the cavities formed by the etching. Layer 38 is preferably partially crossed by the cavities formed by the etching.

In portion A-A, B-B, that is, in the portion where the memory array is formed, the portions of layers 38, 40, 54, 55, and 58 located at the locations of shallow trenches 18 are etched through the openings in layer 60. Thus, layers 40, 54, 55, and 58 are preferably entirely crossed by the cavities formed by the etching. Layer 38 is preferably partially crossed by the cavities formed by the etching.

A layer 62 is formed on the structure. The thickness of layer 62 is such that layer 62 fills the cavities formed at the locations of the shallow trenches and covers, preferably entirely, layer 60.

Layer 62 is made of an electrically-insulating material, for example, of silicon oxide. Preferably, layer 62 is made of the same material as layer 58. Preferably, layer 62 is made of the same material as layer 40.

Figure 4H:
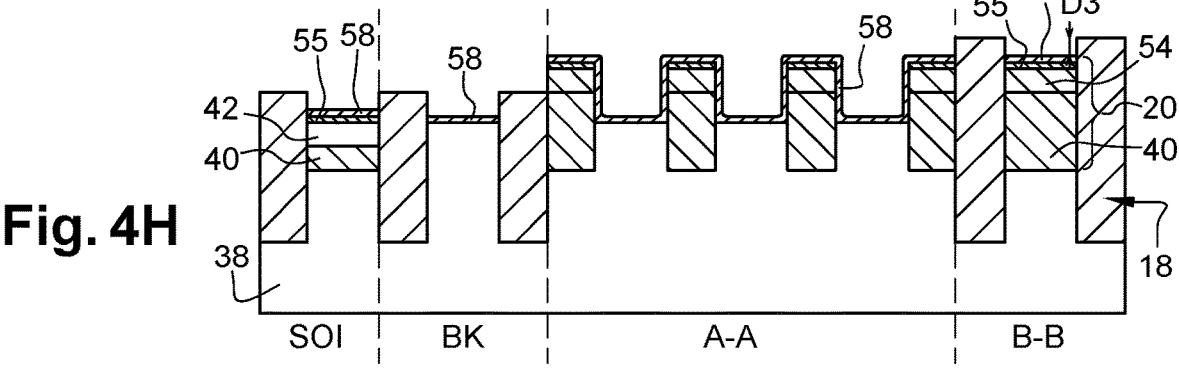

During the step resulting in the structure of FIG. 4H, the structure undergoes a step of polishing, for example, by a chemical mechanical polishing method. The polishing method is carried out to expose, preferably entirely, an upper surface of layer 60.

In portion SOI, the portion of layer 62 located above the level of the upper surface of layer 60 is for example removed. The upper surface of the device in portion SOI is thus planar and comprises the upper surface of layer 60 laterally surrounded with the upper surface of layer 62.

In portion BK, the portion of layer 62 located above the level of the upper surface of layer 60 is for example removed. The upper surface of the device in portion BK is thus planar and comprises the upper surface of layer 60 laterally surrounded with the upper surface of layer 62.

In portion A-A, B-B, layers 60 and 62 are polished to remove all the material of layer 62 located above layer 60. Thus, layers 60 and 62 are removed all the way to the level of the portion of layer 60 closest to layer 38. The upper surface of the device in portion A-A, B-B is thus planar and comprises the upper surface of layer 60 laterally surrounded with the upper surface of layer 62. No portion of layer 60 in portion A-A, B-B is separated from the upper surface of the device by a portion of layer 62.

The portions of layer 60 are then removed by a step of etching of the material of layer 60 selective over the material of layer 58 and the material of layer 62. Thus, the plane of the upper surface of the shallow trenches 18 is separated from the plane of the upper surface of layer 58 by a height substantially corresponding to the thickness of layer 60.

The method further comprises, after the step described in relation with FIG. 4H, a step during which various steps of manufacturing of electronic components may be carried out. In particular, semiconductor material doping steps are carried out.

The layer 42 of portion SOI and the layer 38 of portion BK are for example doped to form electronic components, in particular transistors. Similarly, the layer 38 of portion A-A, B-B is doped to form regions 22a, 22b, and 22c.

The doping steps for example comprise the forming and the removal of masks, for example, lithophotography masks. These steps cause the partial removal of the material of layer 58 and of the shallow trenches. Thus, layer 58 is removed during these steps. Preferably, the thickness of layer 58 is such that layer 58 is fully removed. The portions of layer 54, and for example the portions of layer 55, located on trenches 20 are not removed. Further, the height of the shallow trenches, in particular the trenches 18 of the memory array, is decreased by the steps of forming and of removal of the masks.

Strips 26 are then formed on the portions of layer 54 or 55 located on trenches 20. Layer 28, not shown in FIG. 4H, made of polysilicon is then formed on the structure.

The presence and the maintaining of the portions of layer 54 enable to decrease the distance between portions 26a and 26b of strips 26 (FIGS. 2A and 2B). Thus, the lower and upper planes, that is, portions 26a and 26b, are separated by a distance D3, shorter than distance D1. In other words, the upper surfaces of trenches 18 and 20 are separated by distance D. Distance D3 is for example shorter than 10 nm. Further, portions 26a are more strongly separated from regions 22c, which enables to avoid current leakages.

The memory cells are then formed on regions 22c. In particular, vias 13 are then formed on regions 22c.

Various embodiments and variants have been described. Those skilled in the art will understand that certain features of these various embodiments and variants may be combined, and other variants will occur to those skilled in the art. In particular, although the drawings show a device comprising a portion SOI comprising electronic components formed inside and on top of an SOI-type substrate and a portion BK comprising electronic components formed inside and on top of a solid substrate, the device may only comprise portion BK or portion SOI, in addition to the portion A-A, B-B comprising the memory array.

Finally, the practical implementation of the described embodiments and variations is within the abilities of those skilled in the art based on the functional indications given hereabove.

Method of manufacturing a device may be summarized as including a first portion having an array of memory cells formed therein and a second portion having transistors formed therein, each memory cell being located on a region of a substrate, the method including the following steps: a. the forming of first insulating trenches separating from one another the substrate regions of a same cell row, and b. the forming of second trenches separating from one another the substrate regions of a same cell column, the second trenches having a height greater than the height of the first trenches, step a. including the following steps: a1. the forming of a lower portion of each first trench, and a2. the forming of an upper portion of each first trench, the forming of the upper portions including the deposition of a first insulating layer, the etching of the portions of the first insulating layer which are not located on the upper portions.

The substrate may be of substrate-on-insulator type in the second portion of the device.

The method may include, before steps a. and b., a step c. of removal, in the first portion, of the upper semiconductor layer of a substrate of substrate-on-semiconductor type and the growth of the insulating material of the insulating intermediate layer of the substrate of substrate-on-semiconductor type along a height at least equal to the height of the upper semiconductor layer of the substrate, the intermediate layer being made of a first insulating material.

The method may include, before steps a. and b. and after step c., step d. of forming of the first layer on the first and second portions.

Step a2. may include the forming of first openings in the first layer in front of the locations of the regions, and step a1. may include the etching of the intermediate layer through the first openings, step a2. may include, after step a1, the removal of the portions of the first layer located in the second portion, the first layer being made of a second insulating material.

Step a2. may include the removal of the portions of the first layer located outside of the first portion and the removal of the portions of the intermediate layer and of the first layer located at the locations of the first trenches, the first layer being made of the first insulating material.

The method may include, after step a. and before step b., a step e. of growth of the lower layer of the substrate of semiconductor-on-insulator type at the locations of the regions.

The method may include, after step e., a step f. of forming of a stack may include a second layer made of the first material and a third layer made of the second material on the first and second portions.

The first and second materials may be selectively etchable with respect to each other.

The first material may be silicon oxide and the second may be silicon nitride.

Step b. may include, after step f., the forming of second openings in the third layer of the stack in front of the locations of the second trenches, the forming of cavities through the second openings, and the forming, on the first and second portions, of a fourth layer made of the first material sufficiently thick to fill the cavities.

The method may include, after step b, a step g. of removal by chemical mechanical polishing of the portions of the fourth layer located above the third layer of the stack and a step h. of removal of the third layer.

The method may include, after step h., substrate doping steps.

The method may include the deposition of silicon strips on the upper portions of the first trenches.

Device may be summarized as including a first portion having an array of memory cells arranged therein and a second portion having transistors arranged therein, each memory cell being located on a region of a substrate, the device including first insulating trenches separating from one another the substrate regions of a same cell row, and second trenches separating from one another the substrate regions (22c) of a same cell column, the second trenches having a height greater than the height of the first trenches, wherein the upper surfaces of the first and second trenches are separated by a distance shorter than 10 nm.

Device may be summarized as including a first portion having an array of memory cells arranged therein and a second portion having transistors arranged therein, each memory cell being located on a region of a substrate, the device including first insulating trenches separating from one another the substrate regions of a same cell row, and second trenches separating from one another the substrate regions of a same cell column, the second trenches having a height greater than the height of the first trenches, wherein each first trench includes a lower portion made of a first material and a lower portion of a second material different from the first material, where the second trenches do not include the second material.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a device, comprising:

forming, in a first portion of the device and on a first surface of a substrate, an array of memory cells comprising a plurality of rows and a plurality of columns;

forming, in a second portion of the device, a plurality of transistors;

forming a first plurality of trenches separating a first plurality of substrate regions of each of the plurality of rows, the first plurality of trenches having a first depth into the substrate, the forming of a first plurality of trenches comprising:

forming a first portion of each first trench, the first portion of each first trench being transverse to the first surface of the substrate and extending through the first surface of the substrate; and forming a second portion of each first trench in contact with the first portion of each first trench, the forming a second portion of each first trench comprising forming a first insulating layer and etching a plurality of portions of the first insulating layer; and forming a second plurality of trenches separating a second plurality of substrate regions of each of the plurality of columns, the second plurality of trenches having a second depth into the substrate that is greater than the first depth.

2. The method according to claim 1 wherein the substrate is of substrate-on-insulator type in the second portion of the device.

3. The method according to claim 1, comprising:

removing, in the first portion of the device, an upper semiconductor layer of the substrate, wherein the substrate is of substrate-on-semiconductor type and the upper semiconductor layer has a first thickness; and expanding an insulating intermediate layer of the substrate to a thickness at least equal to the first thickness of the upper semiconductor layer of the substrate, the intermediate layer comprising a first insulating material.

4. The method according to claim 3 wherein the method comprises forming a first insulating layer on the first and second portions of the device.

5. The method according to claim 4 wherein forming the second portion of each first trench comprises forming a first plurality of openings in the first insulating layer, and forming the first portion of each first trench, comprises:

etching the intermediate layer through the first plurality of openings; and removing the portions of the first insulating layer in the second portion of the device, the first insulating layer comprising a second insulating material.

6. The method according to claim 4, comprising removing a first plurality of portions of the first insulating layer on the first portion of the device and removing a second plurality of portions of the intermediate layer and of the first insulating layer on the first plurality of trenches, the first insulating layer comprising the first insulating material.

7. The method according to claim 5, comprising expanding a lower layer of the substrate of semiconductor-on-insulator type.

8. The method according to claim 7 wherein the method comprises forming a stack comprising a second layer of the first insulating material and a third layer on the first and second portions of the device comprising the second insulating material.

9. The method according to claim 8 wherein the first insulating material is silicon oxide and the second insulating material is silicon nitride.

10. The method according to claim 8 wherein forming the second plurality of trenches comprises:

forming a second plurality of openings in the third layer of the stack over the second plurality of trenches;

forming a plurality of cavities through the second plurality of openings; and forming, on the first and second portions of the device and filling the plurality of cavities, of a fourth layer comprising the first insulating material.

11. The method according to claim 10, comprising:

removing, by chemical mechanical polishing of a plurality of portions of the fourth layer on the third layer of the stack; and removing the third layer.

12. The method according to claim 11, comprising doping the substrate.

13. The method according to claim 1, comprising depositing a plurality of silicon strips on a plurality of second portions of each of the first trenches.

14. A method, comprising:

forming a plurality of insulating pillars in a first region of a semiconductor substrate;

forming a semiconductor layer surrounding each of the plurality of insulating pillars in the first region;

forming a first insulating layer on the insulating pillars and the semiconductor layer;

forming a plurality of trenches in a second and a third region of the semiconductor substrate; and forming an insulating material in each of the plurality of trenches.

15. The method according to claim 14, wherein forming the plurality of insulating pillars includes:

forming a mask on a second insulating layer of the semiconductor substrate; and

etching, through openings in the mask, entirely through the second insulating layer along a first direction.

16. The method according to claim 15, wherein the plurality of insulating pillars each include a first portion of the mask, the first insulating layer being formed over each respective first portion of the mask.

17. The method according to claim 16, wherein the semiconductor layer has a first surface that is substantially coplanar with a second surface of the second insulating layer in the second region of the semiconductor substrate.

18. The method according to claim 17, wherein during the forming the first insulating layer, the second insulating layer in the second region of the semiconductor substrate is entirely covered by the first insulating layer.

19. A method, comprising:

forming, on a first surface of a substrate, an array of memory cells including a plurality of rows and a plurality of columns;

forming a first plurality of trenches separating each of the plurality of rows, the forming of the first plurality of trenches including:

forming a first portion of each first trench, the first portion of each first trench extending through the first surface of the substrate; and forming a second portion of each first trench in contact with the first portion of each first trench, the forming a second portion of each first trench including forming an insulating layer and etching a first insulating layer; and forming a second plurality of trenches separating each of the plurality of columns.

20. The method according to claim 19, wherein the first plurality of trenches have a first depth into the substrate and the second plurality of trenches have a second depth into the substrate that is greater than the first depth.

* * * * *